(12) United States Patent
Park et al.

(10) Patent No.: US 8,969,196 B2
(45) Date of Patent: Mar. 3, 2015

(54) SEMICONDUCTOR DEVICES AND METHODS OF MANUFACTURING THE SAME

(75) Inventors: Jin-Ho Park, Yongin-si (KR); Gil-Heyun Choi, Seoul (KR); Byung-Lyul Park, Seoul (KR); Jong-Myeong Lee, Seongnam-si (KR); Zung-Sun Choi, Seoul (KR); Hye-Kyung Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 251 days.

(21) Appl. No.: 13/616,910

(22) Filed: Sep. 14, 2012

(65) Prior Publication Data

US 2013/0005141 A1    Jan. 3, 2013

Related U.S. Application Data

(63) Continuation of application No. 12/688,557, filed on Jan. 15, 2010, now Pat. No. 8,278,207.

(30) Foreign Application Priority Data

Jan. 16, 2009    (KR) .................. 10-2009-0003566

(51) Int. Cl.
*H01L 21/768* (2006.01)
*H01L 21/4763* (2006.01)
*H01L 21/285* (2006.01)
*H01L 23/532* (2006.01)
*H01L 27/115* (2006.01)
*H01L 27/108* (2006.01)

(52) U.S. Cl.
CPC .... *H01L 21/76846* (2013.01); *H01L 21/28562* (2013.01); *H01L 21/76856* (2013.01); *H01L 23/53223* (2013.01); *H01L 23/53238* (2013.01); *H01L 23/53252* (2013.01); *H01L 27/11521* (2013.01); *H01L 27/11524* (2013.01); *H01L 27/10855* (2013.01)
USPC ........... 438/653; 438/652; 438/643; 438/627; 438/656; 438/625; 438/628; 438/642; 438/644; 438/648

(58) Field of Classification Search
CPC .......................... H01L 21/768; H01L 21/4763
USPC ......... 438/653, 652, 656, 625, 627, 628, 642, 438/643, 644, 648
See application file for complete search history.

(56) References Cited

U.S. PATENT DOCUMENTS

| | | | | |
|---|---|---|---|---|
| 6,656,785 | B2 * | 12/2003 | Chiang et al. ................. | 438/240 |
| 7,611,963 | B1 * | 11/2009 | Yang et al. .................... | 438/426 |
| 8,278,207 | B2 * | 10/2012 | Park et al. ..................... | 438/627 |
| 2008/0064205 | A1 * | 3/2008 | Dominguez et al. .......... | 438/653 |

FOREIGN PATENT DOCUMENTS

| | | |
|---|---|---|
| KR | 10-0316061 | 11/2001 |
| KR | 10-0583637 | 5/2006 |
| KR | 1020060041408 A | 5/2006 |

* cited by examiner

*Primary Examiner* — Chuong A Luu
(74) *Attorney, Agent, or Firm* — Myers Bigel Sibley & Sajovec, P.A.

(57) ABSTRACT

A semiconductor device can include an insulation layer on that is on a substrate on which a plurality of lower conductive structures are formed, where the insulation layer has an opening. A barrier layer is on a sidewall and a bottom of the opening of the insulation layer, where the barrier layer includes a first barrier layer in which a constituent of a first deoxidizing material is richer than a metal material in the first barrier layer and a second barrier layer in which a metal material in the second barrier layer is richer than a constituent of a second deoxidizing material. An interconnection is in the opening of which the sidewall and the bottom are covered with the barrier layer, the interconnection is electrically connected to the lower conductive structure.

16 Claims, 14 Drawing Sheets

SEMICONDUCTOR DEVICES AND METHODS OF MANUFACTURING THE SAME

CROSS-REFERENCE TO RELATED APPLICATION

This is a continuation application of U.S. patent application Ser. No. 12/688,557, filed Jan. 15, 2010 now U.S. Pat. No. 8,278,207 in the United States Patent and Trademark Office, and claims priority to Korean Patent Application No. 10-2009-0003566, filed on Jan. 16, 2009 in the Korean Intellectual Property Office (KIPO), the contents of which are herein incorporated by reference in their entirety.

FIELD OF THE INVENTION

Example embodiments relate to semiconductor devices and methods of manufacturing the same, and more particularly, to semiconductor devices having multi-layered wiring structures and methods of manufacturing the same.

BACKGROUND

As semiconductor devices are becoming highly integrated, sizes of source/drain regions and width of gate electrodes and metal wiring in semiconductor devices are being decreased. Thus, multi-layered wirings have been used as a wiring structure of the semiconductor device in which a number of wiring layers are sequentially stacked in a vertical direction and each of the wiring layers are electrically connected to each other by interconnections such as a contact plug.

In general, the wirings in a semiconductor device can be electrically connected to underlying conductive structures such as transistors and are separated from each other by a number of insulation inter-layers. The insulated upper and lower wirings can be electrically connected to each other by the interconnections penetrating through the insulation interlayer. The interconnections may be a metal having low electrical resistance such as aluminum (Al), copper (Cu) and tungsten (W) as the high integration degree of the semiconductor device. Particularly, tungsten (W) has been used for the interconnection due to the quality of step coverage and high pattern facilitation provided.

Metals are generally formed into the wiring structure for a semiconductor device by a deposition process and the deposition process through chemical reactions at a high temperature. Thus, while performing the deposition process, various barrier layers can be provided between the insulation interlayer and the interconnection for preventing the damage to the insulation interlayer and the underlying conductive structures.

Tungsten (W) may have relatively low adherence to the insulation interlayer formed of, for example, an oxide. In addition, tungsten source gases in the deposition process can cause damage to sidewalls of a contact hole or a via-hole. For those reasons, the barrier layer usually includes a glue layer for compensating the adherence to the insulation interlayer and an anti-diffusion layer for reducing the diffusion of fluorine ions (F—), which can be byproducts of the fluorine source gases of the deposition process, into the insulation interlayer. For example, a multilayered structure of titanium and titanium nitride (Ti/TiN), tungsten and tungsten nitride (W/WN) or tantalum and tantalum nitride (Ta/TaN) is sometimes used as the barrier layer. Recently, W/WN structure is also used as the barrier layer because a tungsten (W) plug can be formed continuously with the W/WN barrier layer and electrical resistance between the barrier layer and the contact plug can be reduced.

Various deposition processes based on chemical reactions of source materials have been utilized for forming the WN layer that is conformal with the profile of the contact hole or the via hole and has high quality of step coverage. In such a case, problems may arise in that the contact resistance between the contact plug and a conductive structure underlying the contact plug may be unstable due to rapid temperature variation in the deposition process. Particularly, when copper (Cu) wirings are arranged under the contact plug, random electron migration may be generated on a surface of the copper wiring and thus a plurality of voids may be formed in the copper wirings to thereby increase the contact resistance between the copper wirings and the contact plugs.

SUMMARY

According to some example embodiments, a semiconductor device can include an insulation layer on that is on a substrate on which a plurality of lower conductive structures are formed, where the insulation layer has an opening. A barrier layer is on a sidewall and a bottom of the opening of the insulation layer, where the barrier layer includes a first barrier layer in which a constituent of a first deoxidizing material is richer than a metal material in the first barrier layer and a second barrier layer in which a metal material in the second barrier layer is richer than a constituent of a second deoxidizing material. An interconnection is in the opening of which the sidewall and the bottom are covered with the barrier layer, the interconnection is electrically connected to the lower conductive structure.

In some example embodiments, the metal material may include one of tungsten (W) and titanium (Ti) and the deoxidizing material may include any one material selected from the group consisting of disilane (Si2H6), diborane (B2H6), phosphine (PH3), silane (SiH4) and combinations thereof. The interconnection may include one of aluminum (Al), tungsten (W) and copper (Cu). The lower conductive structure may include one of copper (Cu) wiring and silicon-based material layer and the barrier layer may include a boron-rich tungsten nitride layer in which boron (B) is richer than tungsten (W) and a tungsten-rich tungsten nitride layer in which tungsten (W) is richer than boron (B).

According to other example embodiments, a method of manufacturing a semiconductor device, can be provided by forming an insulation layer on a substrate on which a plurality of lower conductive structures is formed in such a manner that the insulation layer includes an opening, forming a barrier layer on a sidewall and a bottom of the opening of the insulation layer in such a manner that the barrier layer includes a first barrier layer in which a constituent of a first deoxidizing material is richer than a metal material used to form the first barrier layer and a second barrier layer in which a metal material in the second barrier layer is richer than a constituent of a second deoxidizing material used to form the second barrier layer, forming an interconnection in the opening of which the sidewall and the bottom are covered with the barrier layer in such a manner that the interconnection is electrically connected to the lower conductive structure, and forming an upper conductive structure on the insulation layer in such a manner that the upper conductive structure is electrically connected to the interconnection so that the upper conductive structure is electrically connected to the lower conductive structure through the interconnection.

In some example embodiments, the barrier layer may be formed through a step of forming a first preliminary barrier layer on the sidewall and the bottom of the opening and on a surface of the insulation layer at a first temperature and a step of forming a second preliminary barrier layer on the first preliminary barrier layer along a profile of the insulation layer including the opening at a second temperature higher than the first temperature.

In some example embodiments, the first preliminary barrier layer may be formed as follows: first reaction gases having first metal materials may be supplied into a process chamber at a first flow rate, thereby chemisorbing the first reaction gases onto the sidewall and the bottom of the opening and the surface of the insulation layer. Then, first purge gases may be supplied into the process chamber, thereby removing a residual of the first reaction gases that are not chemisorbed out of the process chamber. Second reaction gases having first deoxidizing materials may be supplied into the process chamber at a second flow rate higher than the first flow rate, thereby forming a first metal layer on the sidewall and the bottom of the opening and the surface of the insulation layer in such a composition that the first deoxidizing materials are richer than the first metal materials. Second purge gases may be supplied into the process chamber, thereby removing a residual of the second reaction gases that are not reacted with the first reaction gases and byproducts of chemical reaction out of the process chamber. Finally, the first metal layer may be nitrated, thereby forming a first metal nitride layer in which the first deoxidizing materials are richer than the first metal materials as the first preliminary barrier layer.

In some example embodiments, the first preliminary barrier layer may be formed at the first temperature of about 150° C. to about 350° C. and the second reaction gases are supplied into the process chamber at the second flow rate of about 1.2 to about 3 times of that of the first reaction gases.

In some example embodiments, the preliminary second barrier layer may be formed as follows: third reaction gases having second metal materials may be supplied into the process chamber at the first flow rate, thereby chemisorbing the third reaction gases onto the first metal nitride layer. Then, third purge gases may be supplied into the process chamber, thereby removing a residual of the third reaction gases that are not chemisorbed out of the process chamber. Fourth reaction gases having second deoxidizing materials may be supplied into the process chamber at a third flow rate lower than the second flow rate, thereby forming a second metal layer on the first metal nitride layer in such a composition that the second metal materials are richer than the second deoxidizing materials. Fourth purge gases may be supplied into the process chamber, thereby removing a residual of the fourth reaction gases that are not reacted with the third reaction gases and byproducts of chemical reaction out of the process chamber. Finally, the second metal layer may be nitrated, thereby forming a second metal nitride layer in which the second metal materials are richer than the second deoxidizing materials as the preliminary second barrier layer.

In some example embodiments, the second preliminary barrier layer may be formed at the second temperature of about 150° C. to about 350° C. and the fourth reaction gases are supplied into the process chamber at the third flow rate of about 1 to about 1.2 times of that of the third reaction gases.

According to some example embodiments of the present inventive step, the barrier layer interposed between an insulation interlayer and an interconnection may be formed by a multi-stepped process which may be performed step-by-step from a lower temperature to a higher temperature, and thus the barrier layer may be formed into a multi-layered structure in which the composition of the deoxidize agents and metal materials may be varied step-be-step corresponding to the temperature variation. Therefore, since the deposition process for forming the barrier layer may initiate at a relatively lower temperature, the damage to the lower conductive structure caused by high temperature of conventional deposition process for forming the barrier layer may be sufficiently prevented. Particularly, the thermal budget at the lower conductive structure may be minimized in the deposition process for forming the barrier layer, thereby remarkably decreasing the contact resistance between the interconnection and the lower conductive structure even though the thickness of the interconnection may be sufficiently reduced. In addition, when the lower conductive structure may include a copper (Cu) wiring, electron migration on a surface of the copper wiring caused by the thermal budget may be minimized to thereby prevent voids on the surface of the copper (Cu) wiring.

DETAILED DESCRIPTION OF THE EMBODIMENTS

Figure 1:
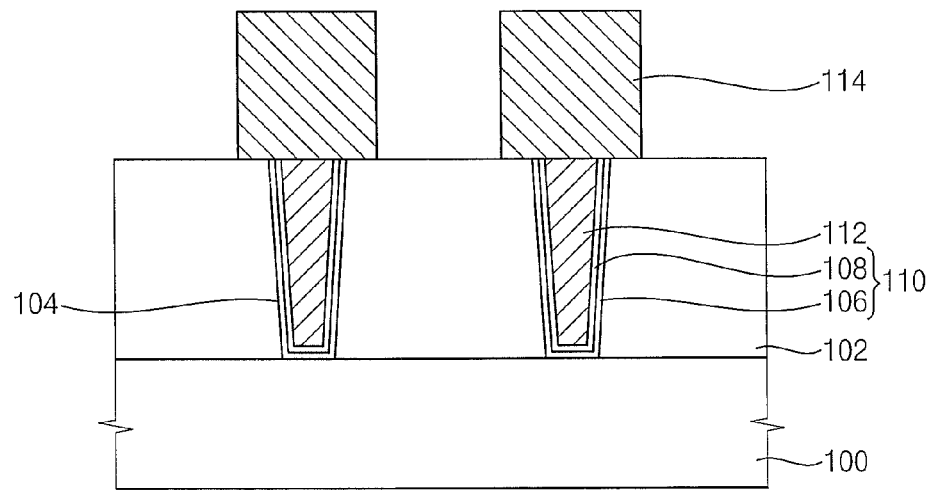
FIG. 1 is a cross-sectional view illustrating a wiring structure for a semiconductor device in accordance with an example embodiment of the inventive concept.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Embodiment 1

FIG. 1 is a cross-sectional view illustrating a wiring structure for a semiconductor device in accordance with an example embodiment of the inventive concept.

Referring to FIG. 1, a substrate 100, which comprises single crystalline silicon, may be provided and a lower conductive structure (not shown) may be formed on the substrate 100. For example, the lower conductive structure may include a MOS transistor or a lower conductive line such as a lower wiring of a multilayered wiring structure in the semiconductor device.

An insulation interlayer 102 may be formed on the substrate 100 and include an opening 104 through which an upper surface of the substrate 100 or an upper surface of the lower conductive structure may be partially exposed. For example, the insulation interlayer 102 may comprise silicon oxide.

A barrier layer 110 may be formed on a sidewall and a bottom of the opening 104. The barrier layer 110 may prevent source gases for forming a contact plug in the opening 104 from diffusing into the insulation interlayer 102 and may improve the adherence of the contact plug to the insulation interlayer 102.

For example, the barrier layer 110 may include a metal nitride layer having a multilayered structure in which impurities may be increased or decreased step-by-step. For example, the barrier layer 110 may include a first tungsten nitride (WN) layer 106 in which impurities of boron (B) and silicon (Si) may be richer than tungsten (W) and a second tungsten nitride (WN) layer 108 in which tungsten (W) may be richer than impurities of boron (B) and silicon (Si). It will be understood that the term "richer" includes embodiments where one constituent material of a layer is included in a greater concentration in the layer than another constituent material.

The first WN layer 106 may be formed on the substrate 100 at a first temperature under the condition that oxidizing agents including boron (B) and silicon (Si) may be supplied to a process chamber at a first flow rate and thus the oxidizing agents may be excessively supplied into the process chamber. Thus, the amount of boron (B) or silicon (Si) may be larger than that of tungsten (W) in the first WN layer 106. In contrast, the second WN layer 108 may be formed on the substrate 100 at a second temperature higher than the first temperature under the condition that the oxidizing agents including boron (B) and silicon (Si) may be supplied to the process chamber at a second flow rate lower than the first flow rate and thus the oxidizing agents may be less supplied into the process chamber as compared with the first WN layer 106. Thus, the amount of boron (B) or silicon (Si) may be smaller than that of tungsten (W) in the second WN layer 108. For example, the second temperature may be in a range of about 200° C. to about 400° C. and the first temperature lower than the second temperature may be in a range of about 150° C. to about 350° C. The second temperature may be an optimal temperature for a deposition process by which the barrier layer may be formed and the first temperature may be a minimal temperature for the deposition process for forming the barrier layer. The first and second temperatures may be varied in accordance with external conditions such as deposition conditions and deposition apparatus requirements.

Therefore, the barrier layer 110 may include the first WN layer positioned on the lower conductive structure at a temperature lower than a deposition temperature and the second WN layer positioned on the first WN layer at the deposition temperature. Accordingly, the lower conductive structure may be exposed to a lower temperature ambient in the deposition process for forming the barrier layer 110, to thereby minimize thermal budget at the lower conductive structure during the deposition process. That is, the lower conductive structure may be sufficiently prevented from the high temperature of the deposition process for forming the barrier layer, to thereby reduce the contact resistance between the lower conductive structure and the metal plug. Particularly, in case that the lower conductive structure may include a copper wiring at a bottom portion of the multilayered wirings, the electron migrations on a surface of the copper wiring caused by temperature variation may be prevented, to thereby minimize voids at the surface of the copper wiring.

While the present example embodiment discloses merely one intermediate temperature corresponding to the first temperature with respect to the deposition temperature corresponding to the second temperature and thus the barrier layer may be formed into a bi-layered structure including the first and the second WN layers 106 and 108, the number of the intermediate temperature may be varied in accordance with processing conditions and device requirements and thus the barrier layer may be formed into a multilayered structure including a plurality of WN layers corresponding to each of the intermediate temperatures. For example, the barrier layer may further include a third WN layer interposed between the first and the second WN layers 106 and 108 and formed at a third temperature of about 170° C. to about 370° C. corresponding to a middle range of the first and the second temperatures.

In such an ideal case that the intermediate temperatures may be infinitesimal between the first and the second temperatures, the barrier layer may include an infinitesimal-layered structure through which the amount of the deoxidizing agents may be continuously changed, and thus no damage may be caused to the lower conductive structure due to the high temperature of the deposition in a theoretical viewpoint. Therefore, the number of the intermediate temperatures may be determined between the first and the second temperatures in accordance with process accuracy, process conditions in relation to the process accuracy and performance of the deposition apparatus.

In an example embodiment, the barrier layer 110 may further include an additional tungsten (W) layer interposed between the first WN layer 106 and the lower conductive structure. The addition tungsten (W) layer may decrease electrical resistance between the lower conductive structure and the contact plug in the opening 104 and may increase the adherence of the contact plug to the insulation interlayer 102. In such a case, the barrier layer 110 may include a bi-layered structure having the tungsten (W) layer and the tungsten nitride (WN) layer in which the amount of the impurities may be varied step-by-step or substantially in a continuous way.

A contact plug 112 may be positioned in the opening 104 and may be electrically connected to a conductive structure such as the lower conductive structure and a metal wiring. For example, the contact plug 112 may include a metal pattern that is formed by a deposition process such as a chemical vapor deposition (CVD) process or an atomic layer deposition (ALD) process. In the present example embodiment, the contact plug 112 may include a tungsten (W) pattern formed by a CVD process.

An upper conductive structure 114 may be positioned on the contact plug 112. For example, the upper conductive structure may include an upper wiring or a bit line that may be electrically connected to MOS transistors on the substrate 100. The upper wiring may be positioned at an upper portion of the multilayered wiring structure. Particularly, the upper wiring of the multilayered wiring structure may comprise aluminum having low electrical resistance and excellent malleability and ductility.

According to the present example embodiment of the wiring structure, the lower conductive structure may be prevented from being damaged due to the high temperature of the deposition process for forming the barrier layer in the contact hole of the insulation interlayer, to thereby minimize thermal budget at the lower conductive structure of a semiconductor device. Therefore, the contact resistance between the contact plug and the lower conductive structure may be sufficiently decreased although the contact plug may have a small thickness. Particularly, the lower conductive structure may include a copper (Cu) wiring, the electron migrations caused by the thermal budget at the copper wiring may be minimized, to thereby sufficiently reduce the void at the surface of the copper (Cu) wiring.

FIGS. 2A to 2F are cross-sectional views illustrating process steps for a method of manufacturing the semiconductor device shown in FIG. 1.

Figure 2A:
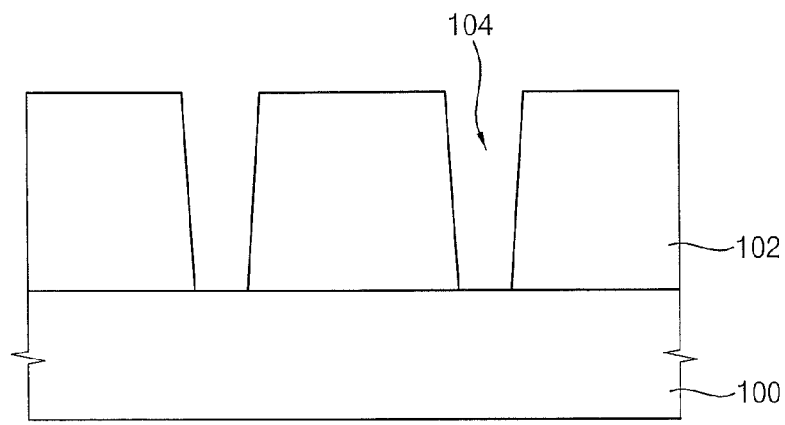
FIGS. 2A to 2F are cross-sectional views illustrating methods of manufacturing the semiconductor device shown in FIG. 1.

Referring to FIG. 2A, the insulation interlayer 102 may be formed on the substrate 100 on which various lower conductive structures may be formed. The substrate 100 may comprise single crystalline silicon. Then, the insulation interlayer 102 may be partially etched off to thereby form the opening 104 through which the upper surface of the lower conductive structure may be exposed.

In an example embodiment, the insulation interlayer 102 may include an oxide layer comprising boron phosphorus silicate glass (BPSG), phosphorus silicate glass (PSG), fluorinated silicate glass (FSG), tetraethyl orthosilicate deposited by a plasma enhanced CVD process (PE-TEOS) and undoped silicate glass (USG).

Then, a mask pattern (not shown) may be formed on the insulation interlayer 102 and the insulation interlayer 102 may be partially removed from the substrate 100 by an etching process using the mask pattern as an etching mask, to thereby form the opening 104 through which the lower conductive structure may be partially exposed. The etching process may include a dry etching process using plasma. The lower conductive structure may include source/drain electrodes of a DRAM device, a source electrode of a flash memory device (corresponding to a string selection area or a ground selection area) and a lower metal wiring. Further, the opening 104 may include a contact hole in which a contact plug for electrically connecting the lower conductive structure and the upper conductive structure and a via hole in which a via plug for electrically connecting an upper and a lower metal wirings may be formed.

Figure 2B:
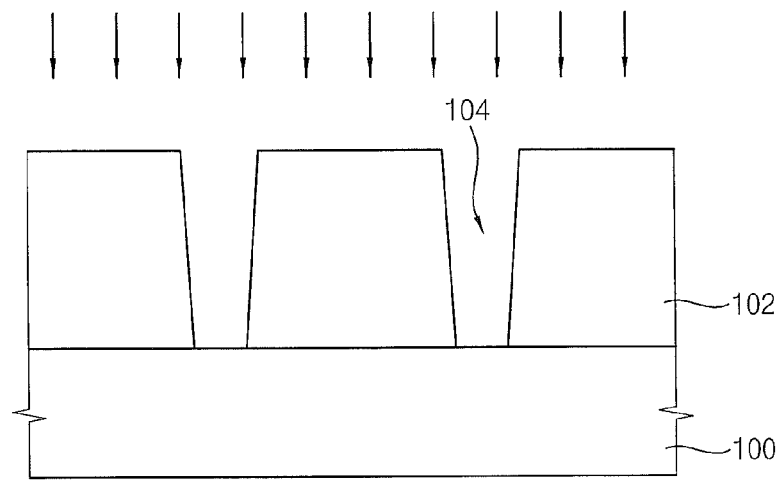

Referring to FIG. 2B, a cleaning process may be performed on the substrate 100 and thus contaminants such as a native oxide layer and a metal oxide layer may be removed from the opening 104. In case that the substrate for a memory device may be exposed through the opening 104, a hydrogen plasma process may be performed to the substrate to remove the native oxide layer and the residual contaminants of an etching process from the substrate. In contrast, in case that a lower wiring of the multilayered wiring structure may be exposed through the opening 104, a pre-treatment process using ammonia, a reactive pre-cleaning process or a radio frequency (RF) pre-cleaning process may be performed to the substrate to remove a metal oxide layer from the substrate. Otherwise, a plasma nitration process may be further performed on the substrate after the cleaning process, thereby curing the insulation interlayer 102 to which damage is caused by the cleaning process.

Figure 2C:
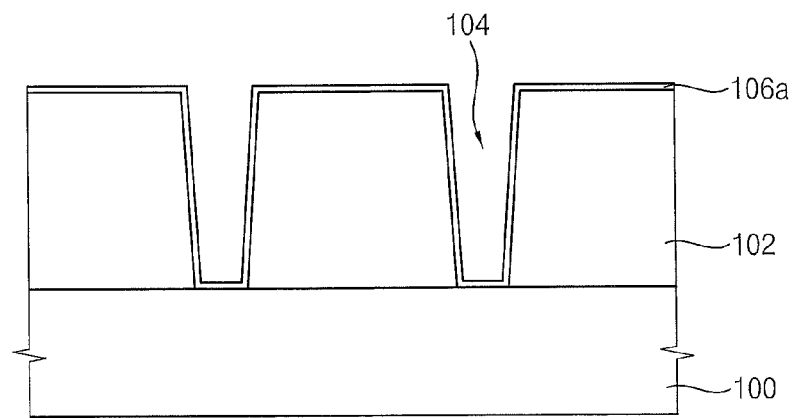

Referring to FIG. 2C, a first metal nitride layer 106a may be formed on the insulation interlayer 102 and a sidewall and a bottom of the opening 104.

In an example embodiment, the first metal nitride layer 106a may be formed by a metal ion plasma process or an atomic layer deposition process at a first temperature using source gases including first conductive metal materials, first deoxidizing agents and nitrogen-based materials. In the present example embodiment, the first metal nitride layer 106a may be formed by an ALD process so as to accurately control a layer thickness.

In the present example embodiment, the substrate 100 on which the insulation interlayer 102 having the opening 104 may be loaded into a process chamber (not shown) for an ALD process, and then first reaction gases including the first conductive metal materials may be supplied into the process chamber. Some of the first reaction gases may be chemisorbed onto the sidewall and the bottom of the opening 104 and a surface of the insulation interlayer 102, and the rest of the first reaction gases may float in the process chamber. Then, a first purge gas including inert gases may be supplied into the process chamber and thus a residual of the first reaction gases that are not chemisorbed to the insulation interlayer 102 may be purged out of the process chamber.

Then, second reaction gases including the first deoxidizing agents may be supplied into the process chamber and may be chemically reacted with the chemisorbed first reaction gases except for the first conductive metal materials, to thereby generate chemical products on the sidewall and the bottom of the opening 104 and on the surface of the insulation interlayer 102. Particularly, the second reaction gases may be excessively supplied into the process chamber over a proper amount that is needed for the chemical reaction with the chemisorbed first reaction gases. Then, the chemical products may float in the space of the process chamber, and thus only the first conductive metal materials may remain on the sidewall and the bottom of the opening 104 and on the surface of the insulation interlayer 102. Therefore, a first metal layer (not shown), which may comprise first conductive metal materials, may be formed on the sidewall and bottom of the opening 104 and on the surface of the insulation interlayer 102. Since the second reaction gases may be provide into the process chamber more than the first reaction gases, the first metal layer may be formed into a deoxidizing material-rich metal layer in which the deoxidizing materials may be richer than the first conducive metal materials.

Then, a second purge gas including inert gases may be supplied into the process chamber, and thus a residual of the second reaction gases that are not chemically reacted with the first reaction gases and the chemical products may be discharged from the process chamber.

The sequential performance of the supply of the first reaction gases, the supply of the first purge gases, the supply of the second reaction gases and the supply of the second purge gases may constitute a unit cycle of the ALD process and the first metal layer may be formed to a unit thickness by performing the unit cycle of the ALD process. Therefore, the thickness of the first metal layer may be determined by the repetition number of the unit cycle of the ALD process.

In an example embodiment, the first conductive metal materials may include tungsten (W) or titanium (Ti). When the first conductive metal materials may include tungsten (W), the first reaction gases including the first conductive materials may include any one of $WF_6$, $WCl_5$, $WBr_6$, $WCo_6$, $W(C_2H_2)_6$, $W(PF_3)_6$, $W(allyl)_4$, $(C_2H_5)WH_2$, $[CH_3(C_5H_4)_2]_2WH_2$, $(C_5H_5)W(Co)_3(CH_3)$, $W(butadiene)_3$, $W(methyl\ vinyl\ ketone)_3$, $(C_5H_5)HW(Co)_3$, $(C_7H_8)W(Co)_3$ and combinations thereof. Examples of the second reaction gases including the first deoxidizing agents may comprise $H_2$, $Si_2H_6$, $B_2H_6$, $PH_3$, $SiH_4$, etc. These may be used alone or in combinations thereof. In addition, the inert gas for the first and the second purge gases may include any one of helium (He), neon (Ne), argon (Ar), xenon (Xe), nitrogen ($N_2$) and combinations thereof.

For example, the ALD process for forming the first metal layer may be performed at a pressure of about 10 Torr to about 350 Torr and at a first temperature of about 150° C. to about 350° C., and the second reaction gases including the first deoxidizing agents may be supplied into the process chamber at a flow rate of about 1.2 to about 3 times of that of the first reaction gases.

When the second reaction gases may be supplied into the process chamber at a flow rate over about 3 times of that of the first reaction gases, the contact plug may be difficult to adhere to the insulation interlayer 102, while at a flow rate below about 1.2 times of that of the first reaction gases, the deoxidization reaction for separating the first conductive metal material from the chemisorbed first reaction gases may be so slow under the first temperature that the efficiency of the ALD process may be remarkably reduced. Accordingly, although the first and the second reaction gases may be supplied into the process chamber at various flow rates, the second reaction gases may be supplied at a flow rate of about 1.2 to about 3 times of that of the first reaction gases.

Therefore, the first metal layer may be formed into the deoxidizing material-rich metal layer in which the deoxidizing materials may be richer than the first conducive metal materials. In the present example embodiment, tungsten (W) may be used as the first conductive metal material and diborane ($B_2H_6$) may be used as the first deoxidizing agent, and thus the first metal layer may be formed into a boron-rich tungsten layer in which boron (B) may be richer than tungsten (W). Otherwise, when silane ($Si_2H_6$) may be used as the first deoxidizing agent, the first metal layer may be formed into a silicon-rich tungsten layer in which silicon (Si) may be richer than tungsten (W).

While the above example embodiment of the present invention discloses an ALD process for reduce the thickness of the first metal layer to be as small as possible, any other deposition process known to one of ordinary skill in the art may also be utilized in place of or in conjunction with the ALD process only if the first metal layer may be formed to as small a thickness as possible. For example, a pulsed layer nucleation (PNL) process or a cyclic CVD process may be utilized in place of or in conjunction with the ALD process.

Then, third reaction gases including the nitrogen-based materials may be supplied into the process chamber and the first metal layer may be nitrated by chemical reactions with the third reaction gases, thereby forming a first metal nitride layer 106a on the sidewall and the bottom of the opening 104 and on the surface of the insulation interlayer 102. That is, the first metal nitride layer 106a may be formed into a deoxidizing material-rich metal nitride layer. The third reaction gases may include nitrogen gases. The ALD process for nitrating the first metal layer may be performed at a pressure of about 10 Torr to about 350 Torr and at a temperature of about 200° C. to about 550° C. The nitration process for forming the first metal nitride layer may be performed at the same temperature as that of the deposition process for forming the first metal layer. However, the temperature of the nitration process for nitrating the first metal layer may be higher than that of the deposition process for forming the first metal layer on condition that the lower conductive structure may be sufficiently prevented from damaged by the high temperature of the nitration process, as would be known to one of the ordinary skill in the art.

While the present example embodiment discloses that the deposition process for forming the first metal layer and the nitration process for nitrating the first metal layer may be performed by an ALD process in the same single process chamber, the deposition process and the nitration process may be performed by individual processes different from each other in separate process chambers. For example, after the completion of the ALD process for forming the first metal layer, the first metal layer may be nitrated in a separate process chamber by a heat treatment in nitrogen ambient or a nitrogen plasma process.

Therefore, the process temperature of the deposition process for forming the first metal layer may be sufficiently reduced to prevent damage to the lower conductive structure and the flow rate of the second reaction gases may be sufficiently increased to compensate for decrease of the reaction rate due to the low process temperature. Accordingly, the first metal nitride layer 106a may be formed on the substrate 100 without deterioration of process efficiency and thermal budget to the lower conductive structure.

Figure 2D:
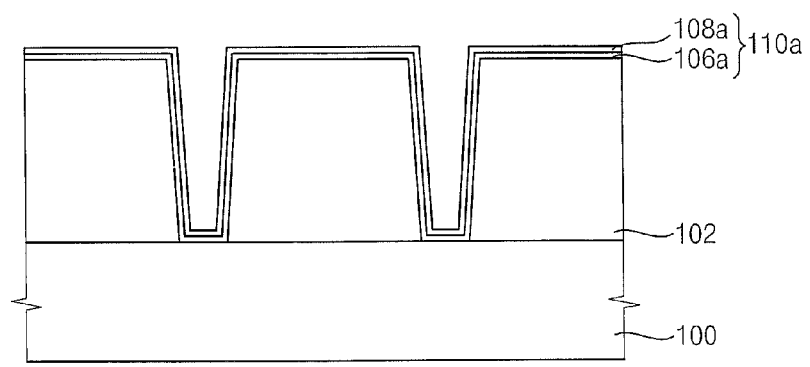

Referring to FIG. 2D, a second metal nitride layer 108a may be formed on the first metal nitride layer along a profile of the insulation interlayer 102 having the opening 104.

In an example embodiment, the second metal nitride layer 108a may be formed by a metal ion plasma process or an ALD process at a second temperature using source gases including second conductive metal materials, second deoxidizing agents and nitrogen-based materials. In the present example embodiment, the second metal nitride layer 108a may be formed by an ALD process so as to accurately control a layer thickness similar to the method of forming the first metal nitride layer 106a.

In the present example embodiment, the substrate 100 on which the first metal nitride layer 106a may be loaded into a process chamber (not shown) for an ALD process, and then first reaction gases including the second conductive metal materials may be supplied into the process chamber. Particularly, the second metal nitride layer 108a may be formed in the same process chamber as used for forming the first metal nitride layer 106a, and thus the first metal nitride layer 106a and the second metal nitride layer 108a may be formed in the same single process chamber without alteration of process chambers to thereby prevent any defects caused by variation of process conditions due to the alteration of process chambers. For example, the first metal nitride layer 106a may be formed at a first process section of the process chamber and the second metal nitride layer 108a may be formed at a second process section adjacent to the first process section of the process chamber. The first and the second process sections may be divided into separate spaces by a separator such as an air curtain and thus the first and second metal nitride layers 106a and 108a may be formed in each section independently from each other.

Then, a second metal layer (not shown) may be formed on the first metal nitride layer 106a by the same ALD process as described for forming the first metal layer, except that the ALD process may be performed at the second temperature higher than the first temperature and the second reaction gases including the second deoxidizing agents may be supplied into the process chamber at a flow rate of about 1 to about 1.2 times of that of the first reaction gases. That is, the ALD process for forming the second metal layer may be performed at the second temperature higher than the first temperature, and the second reaction gases including the second deoxidizing agents may be supplied into the process chamber as much as may be needed for chemical reaction with the first reaction gases. Thus, the second metal layer may be formed on the first metal nitride layer 106a into a metal material-rich metal layer in which the second conductive metal materials may be richer than the second deoxidizing agents. For example, the second metal layer may be formed into a pure metal layer without any deoxidizing agents.

In the same way as described above, the first and second purge gases including inert gases may be supplied into the process chamber and thus a residual of the first and the second reaction gases that are not chemically reacted may be purged out of the process chamber. The sequential performance of the supply of the first reaction gases, the supply of the first purge gases, the supply of the second reaction gases and the supply of the second purge gases may constitute a unit cycle of the ALD process for forming the second metal layer and the second metal layer may be formed to a unit thickness by performing the unit cycle of the ALD process. Therefore, the thickness of the second metal layer may be determined by the repetition number of the unit cycle of the ALD process.

In an example embodiment, the second conductive metal materials may include tungsten (W) or titanium (Ti). When the second conductive metal materials may include tungsten (W), the first reaction gases including the second conductive metal materials may include any one of WF6, WCl5, WBr6, WCo6, W(C2H2)6, W(PF3)6, W(allyl)4, (C2H5)WH2, [CH3(C5H4)2]2WH2, (C5H5)W(Co)3(CH3), W(butadiene)3, W(methyl vinyl ketone)3, (C5H5)HW(Co)3, (C7H8)W(Co)3 and combinations thereof. Examples of the second reaction gases including the second deoxidizing agents may comprise H2, Si2H6, B2H6, PH3, SiH4, etc. These may be used alone or in combinations thereof. In addition, the inert gas for the first and the second purge gases may include any one of helium (He), neon (Ne), argon (Ar), xenon (Xe), nitrogen (N2) and combinations thereof. In the present example embodiment, the second conductive metal materials may be substantially the same as the first conductive metal materials and the second deoxidizing agents may be substantially the same as the first deoxidizing agents.

For example, the ALD process for forming the second metal layer may be performed at a pressure of about 10 Torr to about 350 Torr and at a first temperature of about 200° C. to about 400° C., and the second reaction gases including the second deoxidizing agents may be supplied into (the second process section of) the process chamber at a flow rate of about 1 to about 1.2 times of that of the first reaction gases including the first conductive metal materials.

Accordingly, the second metal layer may be formed on the first metal nitride layer 106a into the metal material-rich metal layer in which the second conductive metal materials may be richer than the second deoxidizing agents.

In the present example embodiment, tungsten (W) may be used as the second conductive metal material, and thus the second metal layer may be formed into a tungsten-rich tungsten layer in which tungsten (W) may be richer than the deoxidizing agents regardless of the kind of the second deoxidizing agents.

While the above example embodiment of the present invention discloses an ALD process for reduce the thickness of the second metal layer to be as small as possible, any other deposition process known to one of ordinary skill in the art may also be utilized in place of or in conjunction with the ALD process if the second metal layer may be formed to as small a thickness as possible. For example, a pulsed layer nucleation (PNL) process or a cyclic CVD process may be utilized in place of or in conjunction with the ALD process.

Then, third reaction gases including the nitrogen-based materials may be supplied into the process chamber and the second metal layer may be nitrated by chemical reactions with the third reaction gases, thereby forming the second metal nitride layer 108a on the first metal nitride layer 106a. That is, the second metal nitride layer 108a may be formed into a metal material-rich metal nitride layer.

The third reaction gases may include nitrogen gases or ammonia gases. The ALD process for nitrating the second metal layer may be performed at a pressure of about 10 Torr to about 350 Torr and at a temperature of about 200° C. to about 550° C. The nitration process for nitrating the second metal layer may be performed at the same temperature as that of the deposition process for forming the second metal layer. However, the temperature of the nitration process for nitrating the second metal layer may be higher than that of the deposition process for forming the second metal layer in view of reaction rate of the third reaction gases, because the damage to the lower conductive structure due to the high temperature of the nitration process may be sufficiently prevented by the first metal nitride layer 106a.

Thus, the first metal nitride layer 106a in which the deoxidizing agents may be richer than conductive metal materials may be formed on the sidewall and the bottom of the opening 104 and on the surface of the insulation interlayer 102 at a relatively lower temperature and the second metal nitride layer 108a in which the conductive metal materials may be richer than the deoxidizing agents may be formed on the first metal nitride layer 106a along a profile of the insulation interlayer 102 having the opening 104 at a relatively higher temperature, thereby forming a preliminary barrier layer 110a along a profile of the insulation interlayer 102 having the opening 104.

Figure 2E:
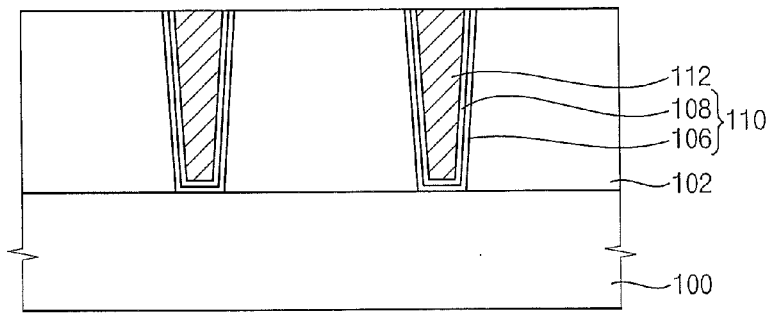

Referring to FIG. 2E, a conductive layer (not shown) may be formed on the substrate 100 including the preliminary barrier layer 110a to a sufficient thickness to fill up the opening 104. For example, third conductive metal materials may be deposited onto the preliminary barrier layer 110a by a CVD process to thereby form the conductive layer to a thickness to fill up the opening 104 of the insulation interlayer 102. The third conductive metal materials may include any one of tungsten (W), aluminum (Al), copper (Cu) and combinations thereof.

Then, the conductive layer may be partially removed from the preliminary barrier layer 110a until an upper surface of the insulation interlayer 102 may be exposed. The partial removal of the conductive layer may be performed by a planarization process such as a chemical mechanical polishing (CMP) process. Thus, the conductive layer may remain merely in the opening 104 of which the sidewall and the bottom may be covered with the preliminary barrier layer 110a, thereby forming a barrier layer 110 and a conductive plug 112 in the opening 104 of the insulation interlayer 102. Therefore, the conductive plug 112 may be separated from the insulation interlayer 102 and the substrate 100 by the barrier layer 108 enclosing the plug 112 in the opening 104.

Figure 2F:
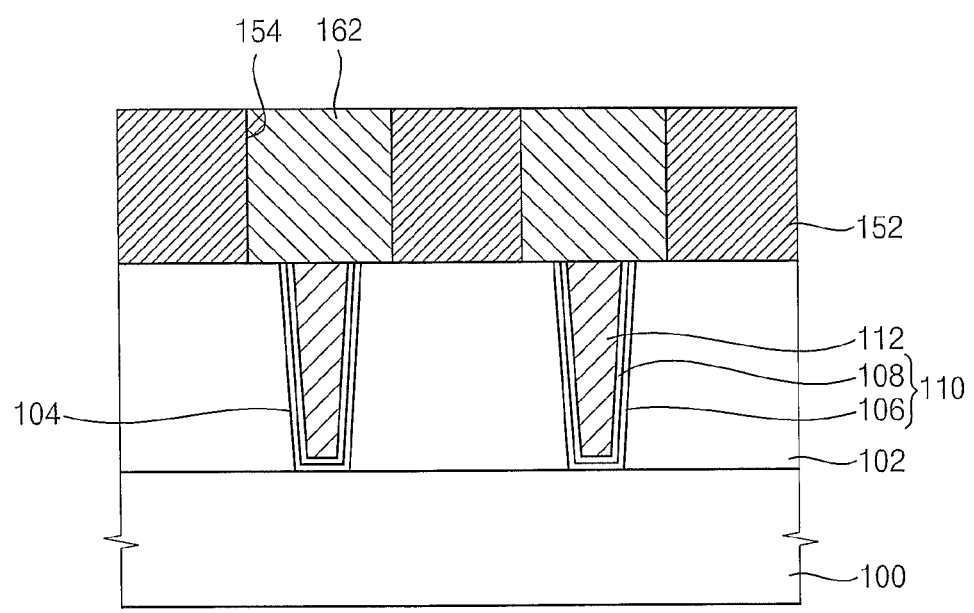

Referring to FIG. 2F, after formation of the conductive plug 112, an additional insulation interlayer 152 may be formed on the insulation interlayer 102, the barrier layer 110 and the conductive plug 112. Then, the additional insulation interlayer 152 may be partially removed by an etching process, to thereby form a hole 154 through which the conductive plug 112 may be exposed. A conductive structure 162 may be formed in the hole 154 and the conductive plug 112 may be electrically connected to the conductive structure 162, to thereby form a wiring structure for a semiconductor device. In an example embodiment, the hole 154 may include a via hole that is formed by a damascene process and the conductive structure 162 may include a metal wiring comprising one of tungsten, aluminum (Al) and copper (Cu).

While the present example embodiment discloses that the barrier layer 110 may be formed into a bi-layered structure including the first and the second metal nitride layers that are formed by two steps at an intermediate temperature corresponding to the first temperature and a deposition temperature corresponding to the second temperature, the number of the intermediate temperatures may be varied in accordance with processing conditions and device requirements and thus the barrier layer may be formed into a multilayered structure including a plurality of metal nitride layers corresponding to each of the intermediate temperatures.

Particularly, the formation processes for forming each metal nitride layer at different temperature may be performed at different process sections in the same single process chamber to thereby prevent any defects caused by variation of process conditions except a temperature due to the alteration of process chambers. The process sections may be divided into separate spaces by a separator such as an air curtain in the single process chamber and thus each formation process for forming the metal nitride layer may be formed in the respective process sections independently from each other.

According to the method of forming a wiring structure for a semiconductor device, the barrier layer may be formed into a bi-layered structure by a two-stepped deposition process having a high temperature process and a low temperature process. Thus, the barrier layer may include a first barrier layer in which the deoxidizing agents may be richer than the conductive metal materials and a second barrier layer in which the conductive metal materials may be richer than the deoxidizing agents. Therefore, the damage to the lower conductive structure caused by high temperature of the deposition process may be prevented during the deposition process for forming the barrier layer. Particularly, thermal budget at the lower conductive structure may be sufficiently minimized in the deposition process for forming the barrier layer. In addition, the contact resistance between the conductive plug and the lower conductive structure may be sufficiently decreased although the conductive plug may have a small thickness. Particularly, the lower conductive structure may include a copper (Cu) wiring, the electron migrations caused by the thermal budget at the copper wiring may be remarkably minimized, to thereby sufficiently reduce the void at the surface of the copper (Cu) wiring.

Embodiment 2

Figure 3:
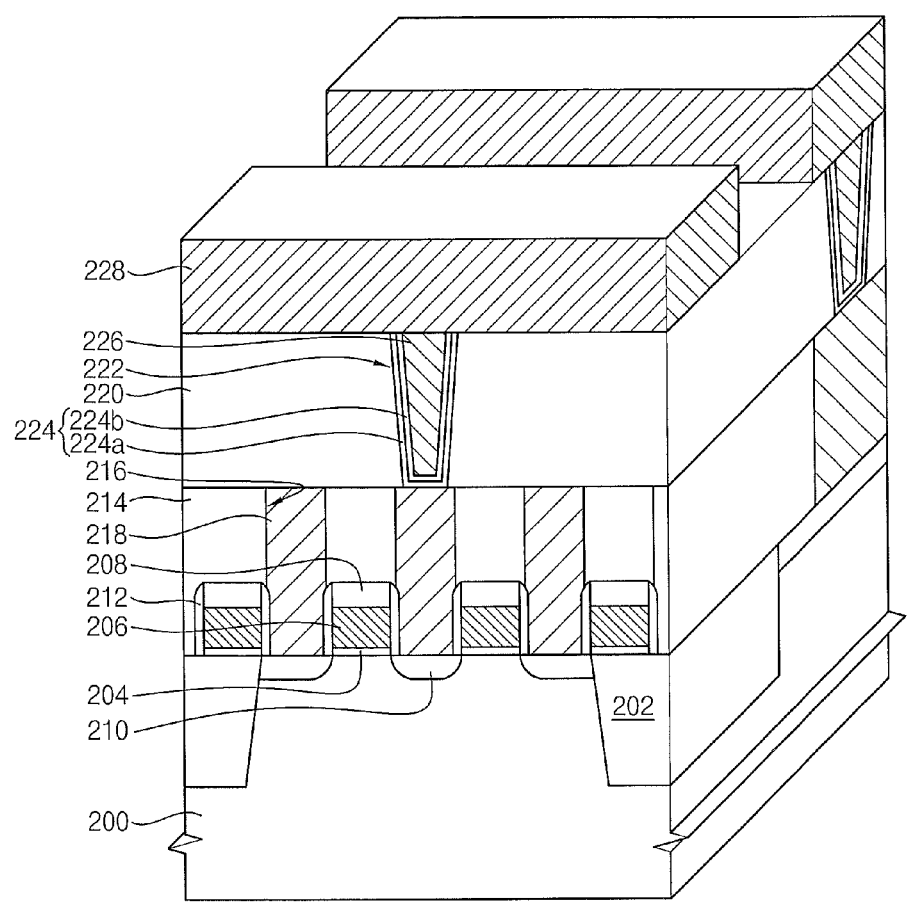
FIG. 3 is a perspective view illustrating a volatile memory device having the wiring structure shown in FIG. 1 in accordance with an example embodiment of the present inventive concept.

FIG. 3 is a perspective view illustrating a volatile memory device having the wiring structure shown in FIG. 1 in accordance with an example embodiment of the present inventive concept. In FIG. 3, a dynamic random access memory (DRAM) device may be exemplarily illustrated as a representative of the volatile memory device.

Referring to FIG. 3, a DRAM device 900 in accordance with an example embodiment of the present inventive concept may include a substrate 200 on which active regions and device isolation regions may be divided by a device isolation layer 202. A plurality of MOS transistors may be positioned on the substrate 200 and each of the transistor may include a gate oxide layer 204, a gate electrode 206 as a word line of the transistor and source/drain electrodes 210 adjacent to the gate electrode 204. A first hard mask pattern 208 comprising silicon nitride may be positioned on the gate electrode 206 and a spacer 212 may be positioned on sidewalls of the gate electrode 206 and the first hard mask pattern 208.

A first insulation interlayer 214 may be arranged on the substrate and have a sufficient thickness to cover the MOS transistors. A top surface of the first insulation interlayer 214 may be planarized.

The first insulation interlayer 214 may include first openings 216 through which the source/drain electrodes 210 may be exposed. The first opening 216 may be self-aligned between the gate electrodes 206 by the first hard mask pattern 208 and the spacer 212, and thus the first hard mask pattern 208 and the spacer 212 may be partially exposed through the first opening 216.

A contact plug 218 may be positioned in the first opening 216. For example, the contact plug 218 may comprise polysilicon doped with impurities and function as a landing pad making contact with the source/drain electrodes 210. When a bit line contact 226 and a storage node contact (not shown) of the DRAM device 900 makes direct contact with the source/drain electrodes 210, the length of the bit line contact 226 and the storage node contact may become so long that the electrical resistance ma be increased at the bit line contact 226 and the storage node contact. Thus, the contact plug 218 may be prepared as a landing pad and the bit line contact 226 and the storage node contact may make contact with the landing pads, respectively.

A second insulation interlayer 220 may be positioned on the first insulation interlayer 214 and the contact plug 218 and may have a second opening 222 through which the contact plug 218 may be partially exposed. That is, a surface of the contact plug 218 may become a bottom of the second opening 222.

A wiring structure may be positioned on the second insulation interlayer 220 through which an interconnection may be prepared. Particularly, a barrier layer 224 and a bit line contact 226 enclosed by the barrier layer 224 may be positioned in the second opening 222 of the second insulation interlayer 220 and a bit line 228 may be positioned on the bit line contact 226 and on the second insulation interlayer 220. In the present example embodiment, the wiring structure may include the same structure as described with reference to FIG. 1.

Particularly, the barrier layer 224 may be positioned on a sidewall and the bottom of the second opening 222. In the present example embodiment, the barrier layer 224 may include a first barrier layer 224a in which deoxidizing agents may be richer than conductive metal materials and a second barrier layer 224b in which conductive metal materials may be richer than deoxidizing agents. While the first barrier layer 224a may be formed at a relatively lower temperature, the second barrier layer 224b may be formed at a relatively higher temperature. In the present example embodiment, tungsten (W) may be used as the conductive metal material and diborane (B2H6) or silane (Si2H6) may be used as the deoxidizing agent, and thus the first barrier layer 224a may include a boron-rich tungsten layer or a silicon-rich tungsten layer and the second barrier layer 224b may include a tungsten-rich tungsten layer.

Therefore, since the first barrier layer 224a may be formed at a relatively lower temperature, the damage to the contact plug 218 caused by high temperature of the deposition process may sufficiently be prevented during the deposition process for forming the barrier layer 224, thereby remarkably decreasing the contact resistance between the bit line contact 226 and the contact plug 218.

The bit line contact 226, which may comprise tungsten (W) having lower electrical resistance and excellent step coverage, may be positioned in the second opening 222. The bit line 228 may be positioned on the second insulation interlayer 220 and may make direct contact with the bit line contact 226. For example, the bit line 228 may comprise a low-resistive metal material such as aluminum (Al), tungsten (W) and copper (Cu). Although not shown in FIG. 3, the DRAM device 900 may further include a third insulation interlayer, an additional contact plug penetrating through the second and the third insulation inter-layers and making the drain electrode, a storage node contact making contact with the additional contact pad and a cylindrical capacitor making contact with the storage node contact.

FIGS. 4A to 4E are cross-sectional view illustrating processing steps for a method of manufacturing the volatile memory device shown in FIG. 3.

Figure 4A:
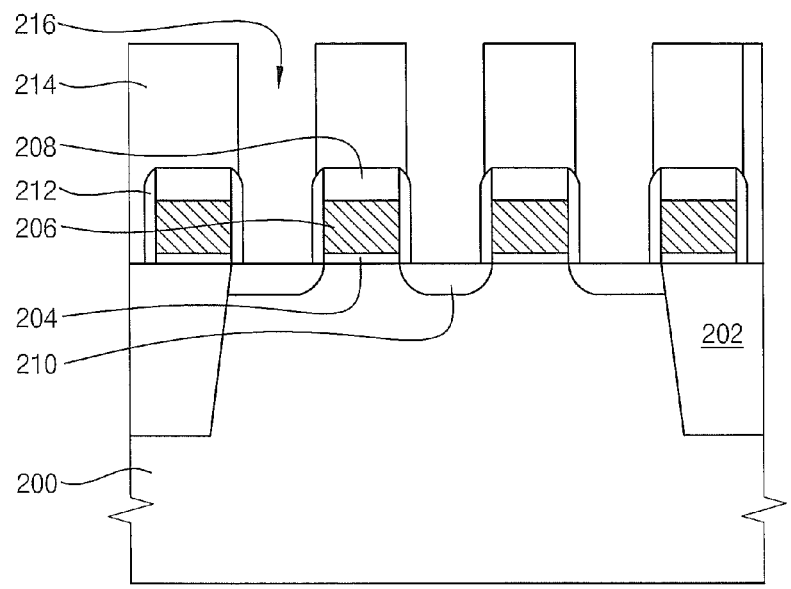
FIGS. 4A to 4E are cross-sectional view illustrating methods of manufacturing the volatile memory device shown in FIG. 3.

Referring to FIG. 4A, a device isolation process such as a shallow trench isolation (STI) process may be performed on a single crystalline silicon substrate, thereby forming the substrate 200 on which the active regions and the device isolation regions may be divided by a device isolation layer (not shown).

An oxide layer, a gate conductive layer and the first hard mask pattern 208 may be sequentially formed on the substrate 200 and an etching process using the first hard mask pattern 208 as an etching mask may be performed on the gate conductive layer, thereby forming the gate electrode 206 on the gate oxide layer 204. Then, impurities may be implanted onto the substrate 200 using the gate electrode 206 as an implantation mask, thereby forming source/drain electrodes 210 at surface portions of the substrate 200. Thus, a MOS transistor including the gate oxide layer 204, the gate electrode 204 and the source/drain electrodes 210 may be formed on the substrate 200.

The gate spacer 212 comprising silicon nitride may be formed on the sidewalls of the gate electrode 206 and the first hard mask pattern 208.

An insulation layer (not shown) may be formed on the substrate to a sufficient thickness to cover the MOS transistors and may be planarized by a planarization process such as a CMP process and an etch-back process, thereby forming the first insulation interlayer 214 on the substrate 200.

Then, the first insulation interlayer 214 may be partially removed from the substrate 200 by a photolithography process, thereby forming first openings 216 through which the source/drain electrodes 210 may be partially exposed. The first insulation interlayer 214 may be etched off by a self-aligned process between the gate electrodes 206 by the first hard mask pattern 208, and thus the first hard mask pattern 208 and the spacer 212 may be partially exposed through the first opening 216.

Figure 4B:
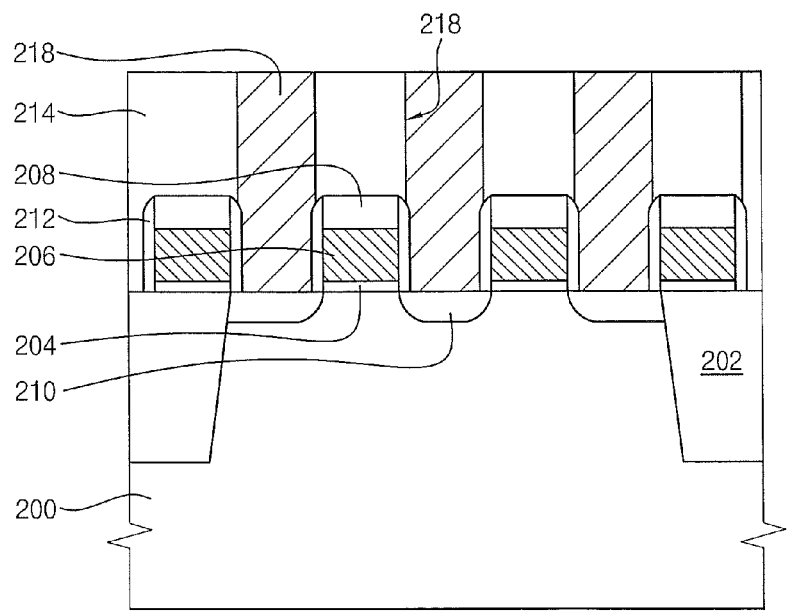

Referring to FIG. 4B, a doped polysilicon layer (not shown) may be formed on the first insulation interlayer 214 to a sufficient thickness to fill up the first openings 216 and may be planarized by a CMP process or an etch-back process until an upper surface of the first insulation interlayer 214 may be exposed. Thus, the polysilicon layer may remain merely in the first opening 216 (node separation step), thereby forming the contact plug 218 making contact with the source/drain electrodes 210. In the present example embodiment, the contact plug making contact with the source electrode may be electrically connected to the bit line and the contact plug making contact with the drain electrode may be electrically connected to the capacitor in a subsequent process.

Figure 4C:
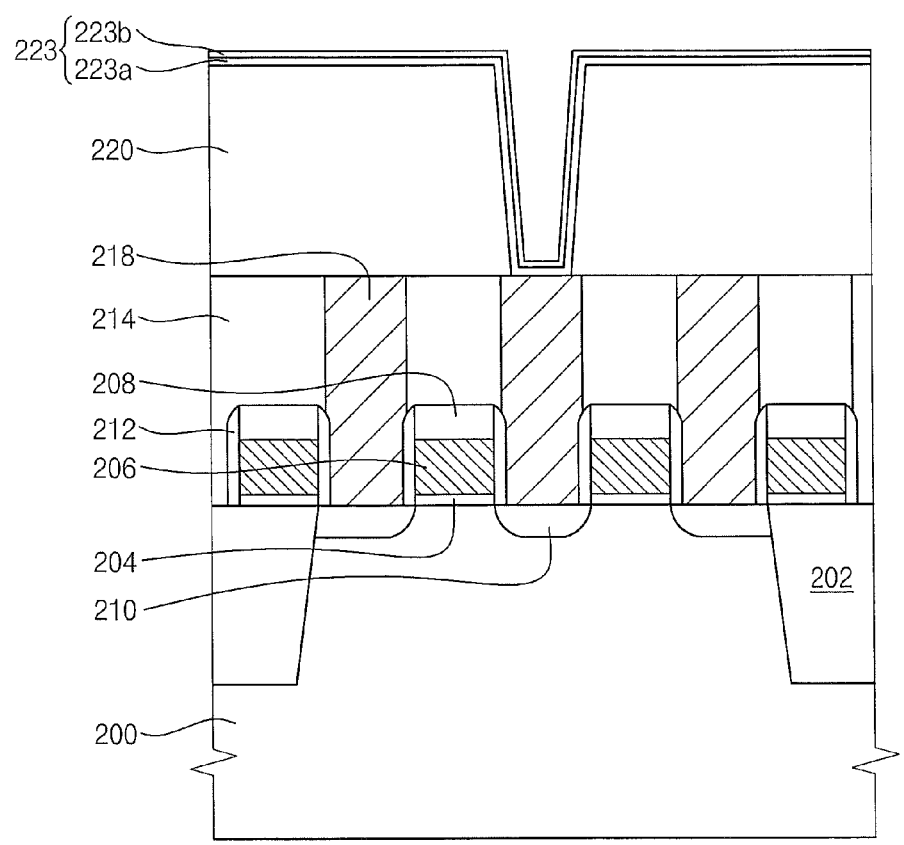

Referring to FIG. 4C, the second insulation interlayer 220 may be formed on the first insulation interlayer 214 and the contact plug 218 and may be partially removed by a photolithography process, thereby forming second openings 222 through which an upper surface of the contact plug making contact with the source electrode may be exposed.

The preliminary barrier layer 223 may be formed on the sidewall and the bottom of the second opening 222 and on the second insulation interlayer 220. In the present example embodiment, the preliminary barrier layer 223 may be formed into a bi-layered structure having the first preliminary barrier layer 223a and the second preliminary barrier layer 223b. The first preliminary barrier layer 223a may be formed into a boron-rich tungsten nitride layer in which boron (B) may be richer than tungsten (W) at a relatively lower temperature. In contrast, the second preliminary barrier layer 223b may be formed into a tungsten-rich tungsten nitride layer in which tungsten (W) may be richer than deoxidizing agents at a relatively higher temperature. Therefore, since the first preliminary barrier layer 223a may be formed at a relatively lower temperature, the damage to the contact plug 218 caused by high temperature of the deposition process may sufficiently be prevented during the deposition process for forming the preliminary barrier layer 223, thereby remarkably decreasing the contact resistance between the bit line contact 226 and the contact plug 218.

The preliminary barrier layer 223 may be formed in the same process as described with reference to FIGS. 2C and 2D in Embodiment 1, and thus any detailed descriptions on the preliminary barrier layer 223 will be omitted.

Figure 4D:
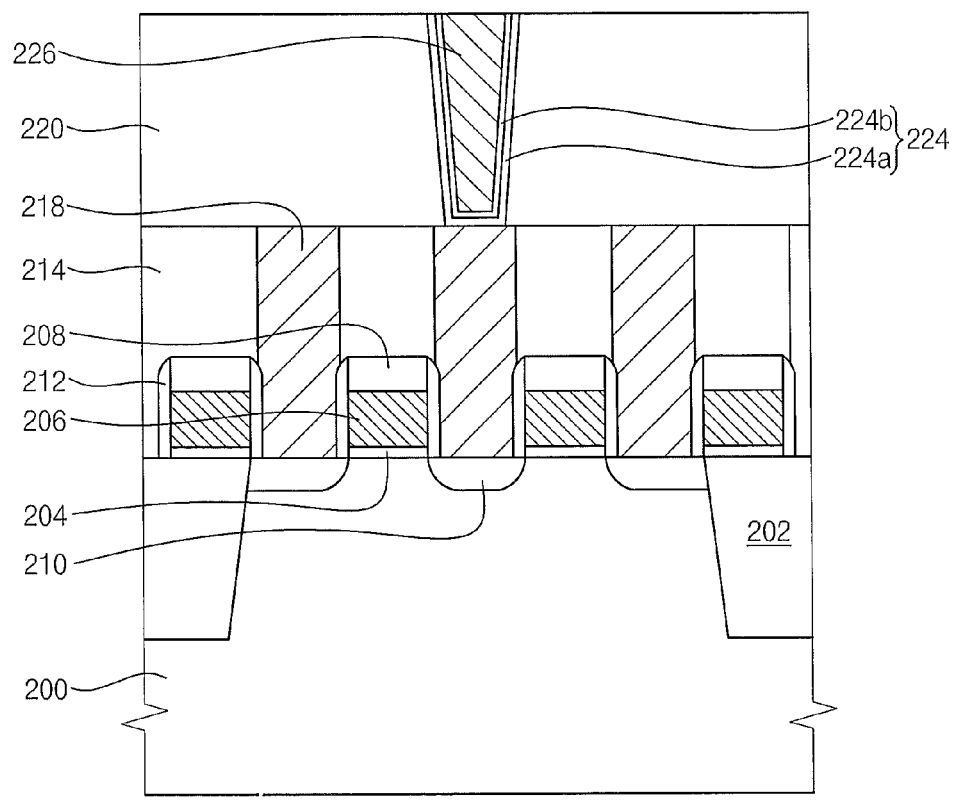

Referring to FIG. 4D, conductive materials may be filled up into the second opening 222 of which the sidewall and the bottom may be covered with the preliminary barrier layer 223, thereby forming the bit line contact 226 enclosed with the barrier layer 224 in the second opening 222.

In an example embodiment, a first conductive layer (not shown) may be formed on the preliminary barrier layer 223 to a sufficient thickness to fill up the second openings 222 and the first conductive layer and the preliminary barrier layer 223 may be planarized by a CMP process or an etch-back process until an upper surface of the second insulation interlayer 220 may be exposed. Thus, the preliminary barrier layer 223 may remain on the sidewall and the bottom of the second opening 222 and may be formed into the barrier layer 224. In addition, the first conductive layer may merely remain in the second opening 222 of which the sidewall and the bottom may be covered with the barrier layer 223 and may be formed into the bit line contact 226 in the second opening 222. In the present example embodiment, the first conductive layer may comprise tungsten (W) having low electrical resistance and excellent step coverage. Various deposition processes may be utilized for forming the first conductive layer, and more particularly, a CVD process may be preferably utilized in the present example embodiment in view of lower electrical resistance and high deposition rate.

Figure 4E:
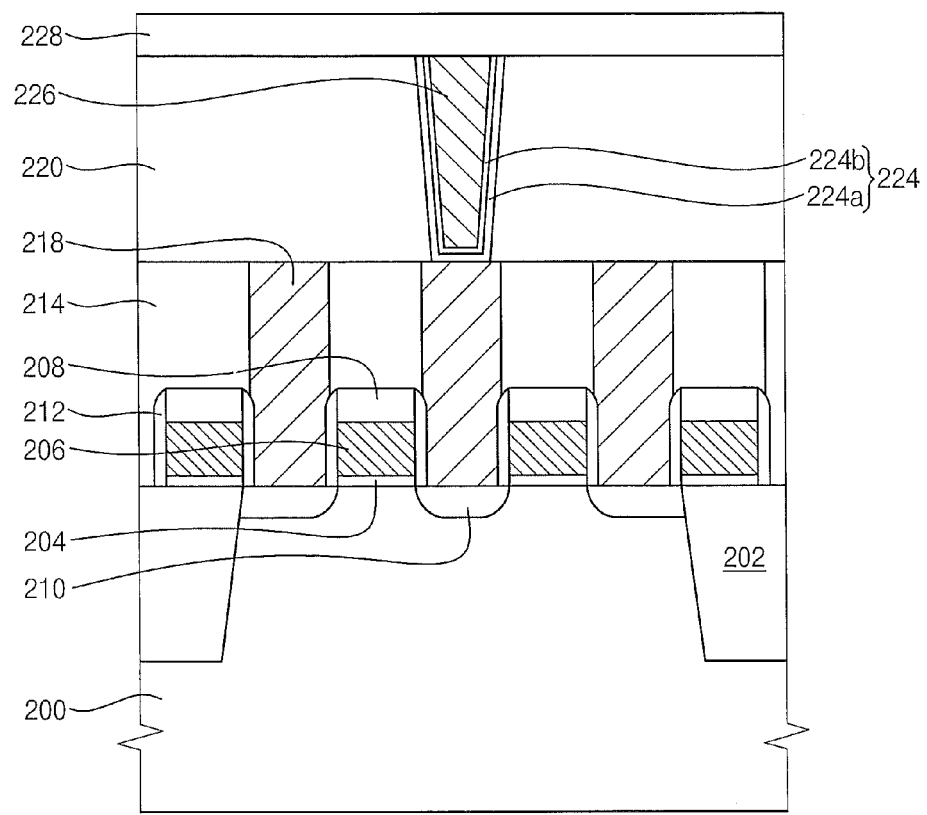

Referring to FIG. 4E, the bit line 228 may be formed on the second insulation interlayer 220 in such a configuration that the bit line contact 226 may make direct contact with the bit line 228.

For example, a second conductive layer (not shown) may be formed on the second insulation interlayer 220, the barrier layer 224 and the bit line contact 226 and a hard mask pattern (not shown) may be formed on the second conductive layer in accordance with a shape of the bit line 228. Then, the second conductive layer may be partially removed from the second insulation interlayer 220 by an etching process using the hard mask pattern as an etching mask, thereby forming the bit line 228 making contact with the bit line contact 226. The bit line 228 may extend in a direction perpendicular to the gate electrode 206 functioning as a word line in the DRAM device 900.

The bit line 228 may comprise a low-resistive metal material such as aluminum (Al), tungsten (W) and copper (Cu).

The process for forming the barrier layer 224, the bit line contact 226 and the bit line 228 may be substantially the same method as described with reference to FIGS. 2E and 2F in Embodiment 1, and thus any detailed descriptions on the formation process for the barrier layer 224, the bit line contact 226 and the bit line 228 will be omitted.

Thereafter, an additional spacer may be further formed on sidewalls of the bit line 228 and the hard mask pattern for forming the bit line 228. Further, although not shown in figures, a third insulation interlayer may be formed on the second insulation interlayer 220 to cover the bit line 228 and a storage node contact may be formed through the third insulation interlayer and may make contact with the contact plug contacting with the drain electrode. Thereafter, a cylindrical capacitor may be formed on the third insulation interlayer in such a configuration that the storage node contact may make contact with the capacitor, thereby completing the DRAM device 900.

According to the above example embodiment of a DRAM device and a manufacturing method thereof, the barrier layer 224 may be formed into a bi-layered structure by a two-stepped deposition process having a high temperature process and a low temperature process. Thus, the barrier layer 224 may include a first barrier layer 224a in which the deoxidizing agents may be richer than the conductive metal materials and a second barrier layer 224b in which the conductive metal materials may be richer than the deoxidizing agents. Therefore, the damage to the contact plug 218 caused by high temperature of the deposition process may be prevented during the deposition process for forming the barrier layer 224. In addition, the contact resistance between the contact plug 218 and the bit line contact 226 may be sufficiently decreased although the bit line contact 226 may have a small thickness.

Embodiment 3

Figure 5:
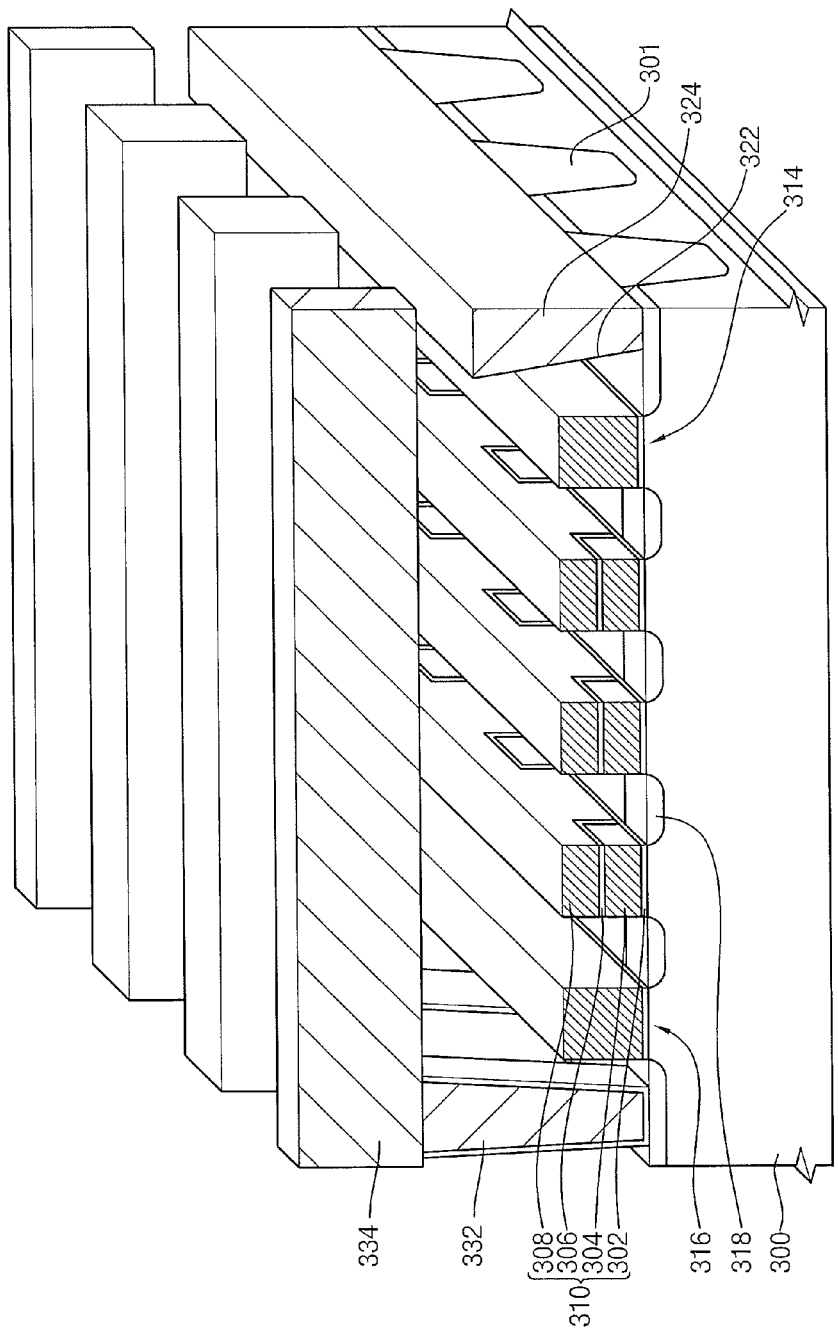
FIG. 5 is a perspective view illustrating a non-volatile memory device having the wiring structure shown in FIG. 1 in accordance with an example embodiment of the present inventive concept.

FIG. 5 is a perspective view illustrating a non-volatile memory device having the wiring structure shown in FIG. 1 in accordance with an example embodiment of the present inventive concept. In FIG. 5, a NAND type flash memory device may be exemplarily illustrated as a representative of the non-volatile memory device.

Referring to FIG. 5, a flash memory device 1000 in accordance with an example embodiment of the present inventive concept may include a substrate 300 on which active regions and device isolation regions may be divided by a device isolation layer 301. The substrate may comprise semiconductor materials such as single crystalline silicon. The device isolation layer 301 may extend in a first direction and thus the active regions and the device isolation regions may be alternately arranged in a second direction perpendicular to the first direction.

A tunnel oxide layer 302 may be positioned on the active region of the substrate 300 and a floating gate electrode 304 may be positioned on the tunnel oxide layer 302 as a conductive pattern. Thus, a plurality of the floating gate electrodes 304 may be periodically positioned in the first direction.

A dielectric layer 306 may be positioned on the floating gate electrode 304. The dielectric layer 306 may include a multilayer in which a silicon oxide, a silicon nitride and a silicon oxide may be sequentially stacked or a metal oxide layer having a grater dielectric constant than a silicon oxide.

A control gate electrode 308 may be positioned on the dielectric layer 306 and may extend in the second direction. A plurality of the control gate electrodes 308 may be periodically arranged in the first direction corresponding to the floating gate electrode 304, and thus each of the floating gate electrodes 304 may be individually controlled by the respective control gate electrodes 308.

Hereinafter, the stacked structure in which the tunnel oxide layer 302, the floating gate electrode 304, the dielectric layer 306 and the control gate electrode 308 may be sequentially stacked is referred to as cell gate structure 310.

An impurity region 318 may be positioned at surface portions of the active region of the substrate 300 adjacent to the cell gate structure 310.

In the present example embodiment of the NAND flash memory device 1000, 32 control gate electrodes 308 periodically arranging in the first direction may constitute an operation unit for reading and writing data. A ground selection line 314 and a string selection line 316 may be positioned at both side portions of the operation unit and may extend in the second direction on the substrate 300. For example, the ground selection line 314 and the string selection line 316 may have substantially the same structure as a MOS transistor having a gate oxide layer and a gate electrode. The impurity region 318 may also be positioned at surface portions of the active region of the substrate 300 adjacent to both of the ground selection line 314 and the string selection line 316.

A first insulation interlayer 320 may be positioned on the substrate 300 and the cell gate structure 310, the ground selection line 314 and the string selection line 316 may be covered with the first insulation interlayer 320.

The first insulation interlayer 320 may include a trench 322 extending in the second direction and through which a surface of the substrate neighboring the ground selection line 314 may be partially exposed. A common source line 324 comprising a conductive material may be positioned in the trench 322, and thus the common source line 324 may also extend in the second direction.

A second insulation interlayer 326 may be positioned on the first insulation interlayer 320.

An opening 328 penetrating the second insulation interlayer 326 and the first insulation interlayer 320 may be arranged at a side portion of the string selection line 316. Thus, a surface of the substrate 300 corresponding to the impurity region 318 may be partially exposed through the opening 328.

A barrier layer 330 comprising metal nitride may be arranged on a sidewall and a bottom of the opening 328, and thus the impurity region 318 may make contact with the barrier layer 330 at the bottom of the opening 328. In the present example embodiment, the barrier layer 330 may include a first barrier layer 330a in which deoxidizing agents may be richer than conductive metal materials and a second barrier layer 330b in which conductive metal materials may be richer than deoxidizing agents. While the first barrier layer 330a may be formed at a relatively lower temperature, the second barrier layer 330b may be formed at a relatively higher temperature. In the present example embodiment, tungsten (W) may be used as the conductive metal material and diborane (B2H6) or silane (Si2H6) may be used as the deoxidizing agent, and thus the first barrier layer 330a may include a boron-rich tungsten layer or a silicon-rich tungsten layer and the second barrier layer 330b may include a tungsten-rich tungsten layer.

Therefore, since the first barrier layer 330a may be formed at a relatively lower temperature, the damage to the impurity region 318 caused by high temperature of the deposition process may sufficiently be prevented during the deposition process for forming the barrier layer 330, thereby remarkably decreasing the contact resistance between the impurity region 318 and a contact plug 332 that is to be described hereinafter.

The contact plug 332, which may comprise a metal having lower electrical resistance and excellent step coverage such as tungsten (W), may be positioned in the opening 328. The bit line 334 may be positioned on the second insulation interlayer 326 and may make direct contact with the contact plug 332. For example, the bit line 334 may comprise a low-resistive metal material such as aluminum (Al), tungsten (W) and copper (Cu).

FIGS. 6A to 6D are cross-sectional view illustrating processing steps for a method of manufacturing the non-volatile memory device shown in FIG. 5.

Figure 6A:
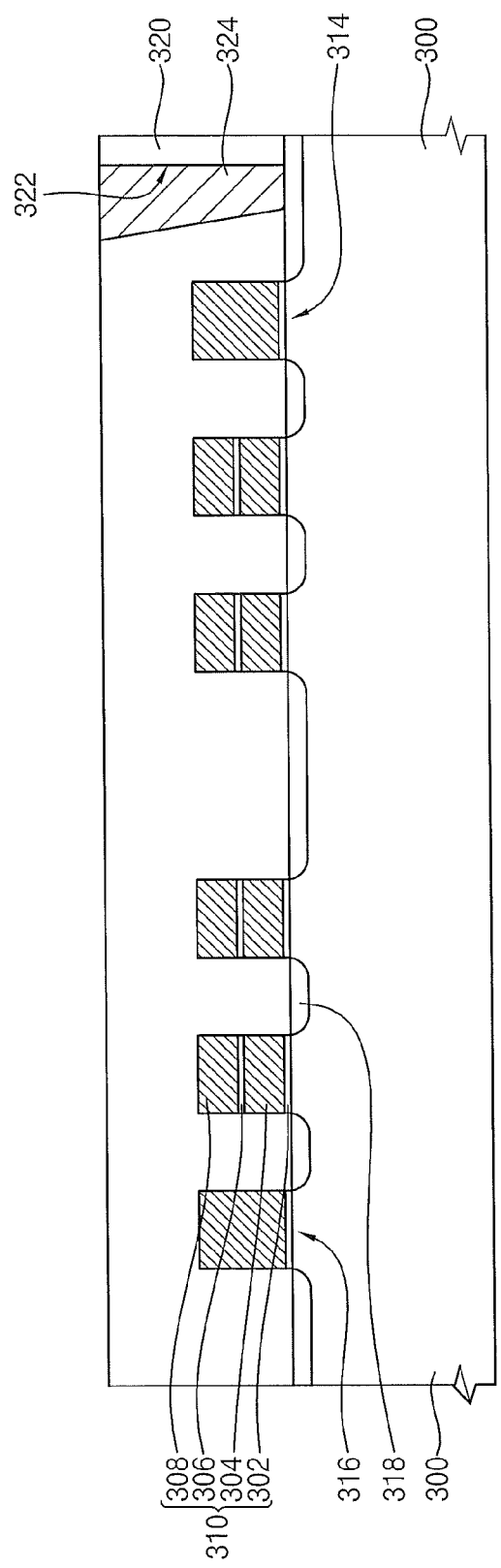
FIGS. 6A to 6D are cross-sectional view illustrating methods of manufacturing the non-volatile memory device shown in FIG. 5.

Referring to FIG. 6A, a device isolation process such as a shallow trench isolation (STI) process may be performed on a single crystalline silicon substrate, thereby forming the substrate 300 on which the active regions and the device isolation regions may be divided by a device isolation layer (not shown).

In the present example embodiment, a shallow trench (not shown) may be formed on the silicon substrate 300 along the first direction by an etching process and insulation materials may be filled up into the shallow trench, thereby forming a device isolation layer (not shown) in the first direction. Thus, the active regions and the device isolation regions may be alternately arranged along the second direction on the substrate 300.

Then, the cell gate structure 310, the string selection line 316 and the ground selection line 314 may be formed on the substrate 300.

In an example embodiment, an oxide layer may be formed on the active region of the substrate 300. The oxide layer may be formed into the tunnel oxide layer 302 and the gate oxide layer in a subsequent process. A first conductive layer (not shown) may be formed on the oxide layer and may be patterned into a first conductive pattern by a photolithography process. The first conductive pattern may be shaped into a line extending in the second direction perpendicular to the first direction. The dielectric layer 306 may be formed on the first conductive pattern. The dielectric layer 306 may be formed into a multilayer in which a silicon oxide, a silicon nitride and a silicon oxide may be sequentially stacked or into a metal oxide layer having a grater dielectric constant than a silicon oxide.

A second conductive layer (not shown) may be formed on the dielectric layer 306.

Then, a photoresist pattern may be formed on the second conductive layer and thus a portion of the second conductive layer corresponding to a memory cell area may be partially exposed through the photoresist pattern. Then, the second conductive layer, the dielectric layer 306 and the first conductive pattern may be sequentially etched off by a dry etching process, thereby forming the cell gate structure 310 extending in the second direction. Thus, the tunnel oxide layer 302, the floating gate electrode 304, the dielectric layer 306 and the control gate electrode 308 may be sequentially stacked in the cell gate structure 310. The string selection line 316 and the ground selection line 314 may be formed by the dry etching process simultaneously with the cell gate structure 310.

Then, impurities may be implanted onto the substrate 300 using the cell gate structure 310, the string selection line 316 and the ground selection line 314 as an implantation mask, respectively, thereby forming the impurity regions 318 at surface portions of the substrate 300 adjacent to the cell gate structure 310, the string selection line 316 and the ground selection line 314.

The first insulation interlayer 320 may be formed on the substrate 300 to a sufficient thickness to cover the cell gate structure 310, the string selection line 316 and the ground selection line 314.

Then, the first insulation interlayer 320 may be partially removed from the substrate 300 by a photolithography process, thereby forming the trench 322 through which a surface of the substrate 300 may be exposed around the ground selection line 314 along the second direction. The first conductive layer (not shown) may be formed on the first insulation interlayer 320 by a deposition process to a sufficient thickness to fill up the trench 322 and then may be planarized until an upper surface of the first insulation interlayer 320 may be exposed by a planarization process such as a CMP, thereby forming the common source line 324 in the trench 322.

Figure 6B:
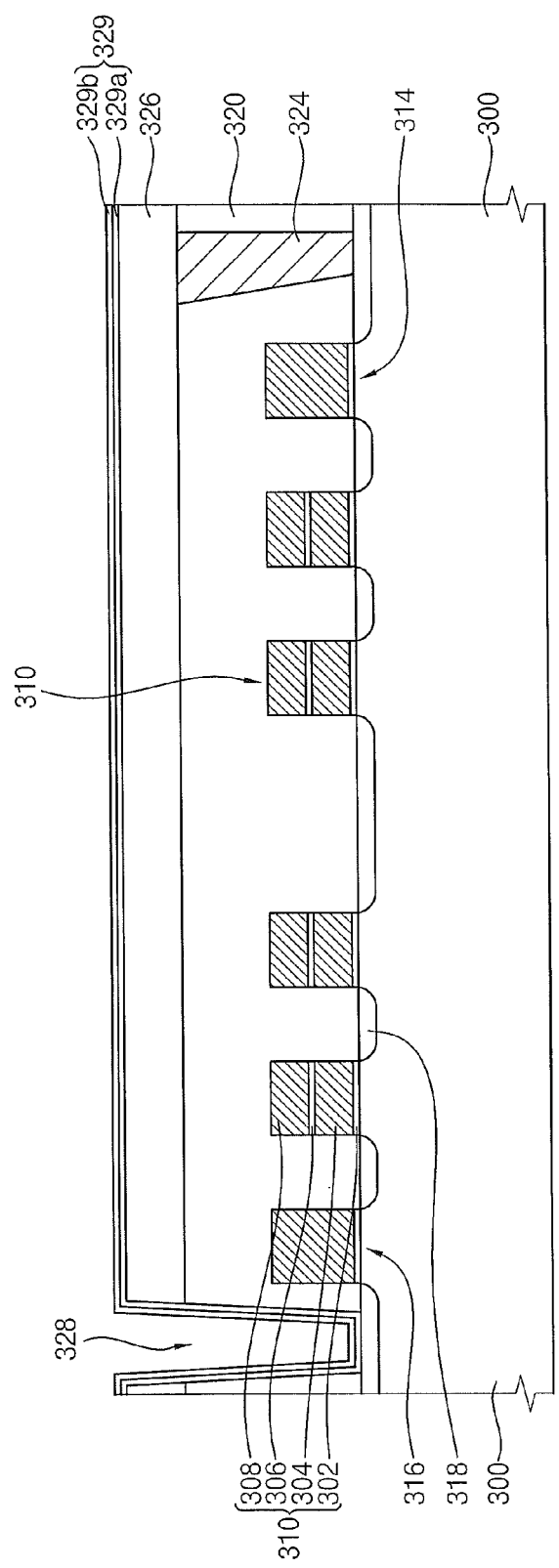

Referring to FIG. 6B, a second insulation interlayer 326 may be formed on the first insulation interlayer 320 through which the common source line 324 may be formed. Then, the second insulation interlayer 326 and the first insulation interlayer 320 may be sequentially etched off, thereby forming an opening 328 through which the substrate 300 neighboring the string selection line 316 may be partially exposed. Thus, the active regions adjacent to the string selection line 316 may be exposed through the opening 328.

A preliminary barrier layer 329 may be formed on a sidewall and a bottom of the opening 328 and on an upper surface of the second insulation interlayer 326. In the present example embodiment, the preliminary barrier layer 329 may be formed into a bi-layered structure having a first preliminary barrier layer 329a and a second preliminary barrier layer 329b. The first preliminary barrier layer 329a may be formed into a boron-rich tungsten nitride layer in which boron (B) may be richer than tungsten (W) at a relatively lower temperature. In contrast, the second preliminary barrier layer 329b may be formed into a tungsten-rich tungsten nitride layer in which tungsten (W) may be richer than deoxidizing agents at a relatively higher temperature. Therefore, since the first preliminary barrier layer 329a may be formed at a relatively lower temperature, the damage to the impurity region 318 of the substrate 300 caused by high temperature of the deposition process may sufficiently be prevented during the deposition process for forming the preliminary barrier layer 329, thereby remarkably decreasing the contact resistance between the impurity region 318 and the contact plug 332.

The preliminary barrier layer 329 may be formed in the same process as described with reference to FIGS. 2C and 2D in Embodiment 1, and thus any detailed descriptions on the preliminary barrier layer 329 will be omitted.

Figure 6C:
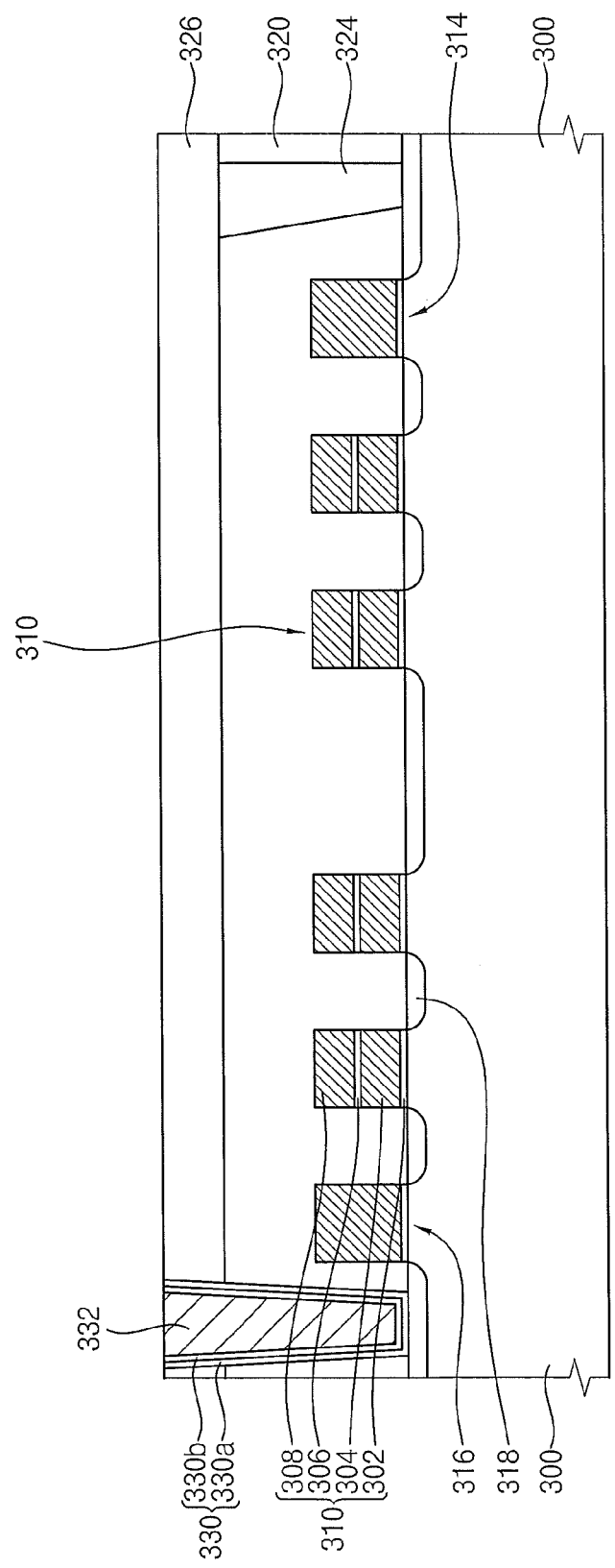

Referring to FIG. 6C, conductive materials may be filled up into the opening 328 of which the sidewall and the bottom may be covered with the preliminary barrier layer 329, thereby forming the contact plug 332 enclosed with the barrier layer 330 in the opening 328.

In an example embodiment, a first conductive layer (not shown) may be formed on the preliminary barrier layer 329 to a sufficient thickness to fill up the opening 328 and the first conductive layer and the preliminary barrier layer 329 may be planarized by a CMP process or an etch-back process until an upper surface of the second insulation interlayer 326 may be exposed. Thus, the preliminary barrier layer 329 may remain on the sidewall and the bottom of the opening 328 and may be formed into the barrier layer 330. In addition, the first conductive layer may merely remain in the opening 328 of which the sidewall and the bottom may be covered with the barrier layer 330 and may be formed into the contact plug 332 in the opening 328. In the present example embodiment, the first conductive layer may comprise tungsten (W) having low electrical resistance and excellent step coverage. Various deposition processes may be utilized for forming the first conductive layer, and more particularly, a CVD process may be preferably utilized in the present example embodiment in view of lower electrical resistance and high deposition rate.

Figure 6D:
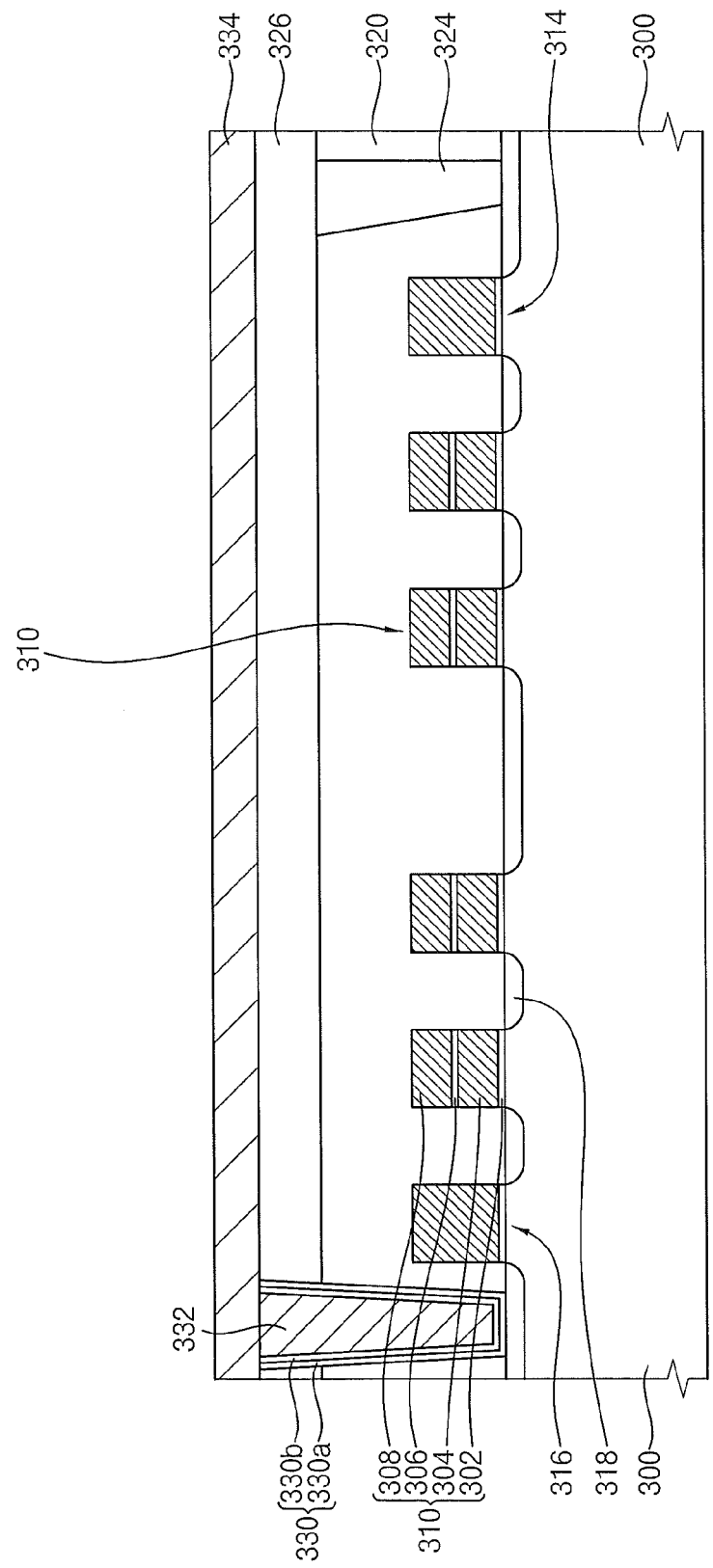

Referring to FIG. 6D, the bit line 324 may be formed on the second insulation interlayer 326 in such a configuration that the contact plug 332 may make direct contact with the bit line 324.

For example, a second conductive layer (not shown) may be formed on the second insulation interlayer 326, the barrier layer 330 and the contact plug 332 and a hard mask pattern (not shown) may be formed on the second conductive layer in accordance with a shape of the bit line 324. Then, the second conductive layer may be partially removed from the second insulation interlayer 326 by an etching process using the hard mask pattern as an etching mask, thereby forming the bit line 324 making contact with the contact plug 332. The bit line 324 may extend in the first direction in the flash memory device 1000 and may comprise a low-resistive metal material such as aluminum (Al), tungsten (W) and copper (Cu).

The process for forming the barrier layer 330, the contact plug 332 and the bit line 324 may be substantially the same method as described with reference to FIGS. 2E and 2F in Embodiment 1, and thus any detailed descriptions on the formation process for the barrier layer 330, the contact plug 332 and the bit line 324 will be omitted.

According to the above example embodiment of a flash memory device and a manufacturing method thereof, the barrier layer 330 may be formed into a bi-layered structure by a two-stepped deposition process having a high temperature process and a low temperature process. Thus, the barrier layer 330 may include a first barrier layer 330a in which the deoxidizing agents may be richer than the conductive metal materials and a second barrier layer 330b in which the conductive metal materials may be richer than the deoxidizing agents. Therefore, the damage to the impurity region 318 of the substrate 300 caused by high temperature of the deposition process may be prevented during the deposition process for forming the barrier layer 330. In addition, the contact resistance between the impurity region 318 and the contact plug 332 may be sufficiently decreased although the contact plug 332 may have a small thickness.

According to the example embodiments of the present inventive concept, the barrier layer interposed between an insulation interlayer and an interconnection may be formed by a multi-stepped process which may be performed step-by-step from a lower temperature to a higher temperature, and thus the barrier layer may be formed into a multi-layered structure in which the composition of the deoxidize agents and metal materials may be varied step-be-step corresponding to the temperature variation. Therefore, since the deposition process for forming the barrier layer may initiate at a relatively lower temperature, the damage to the lower conductive structure caused by high temperature of conventional deposition process for forming the barrier layer may be sufficiently prevented. Particularly, the thermal budget at the lower conductive structure may be minimized in the deposition process for forming the barrier layer, thereby remarkably decreasing the contact resistance between the interconnection and the lower conductive structure even though the thickness of the interconnection may be sufficiently reduced. In addition, when the lower conductive structure may include a copper (Cu) wiring, electron migration on a surface of the copper (Cu) wiring caused by the thermal budget may be minimized to thereby prevent voids on the surface of the copper (Cu) wiring.

Therefore, the wiring structure of the present inventive concept may be applied to an integrated circuit device such as a semiconductor device and various appliances including the integrated circuit devices. Particularly, when a metal plug may be electrically connected to the copper (Cu) wiring in a semiconductor device, the electron migration may be stably controlled and thus the contact resistance between the copper (Cu) wiring and the metal plug may be accurately controlled.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming an insulation layer including an opening on a substrate on which a plurality of lower conductive structures are formed;
    forming a barrier layer on a sidewall and a bottom of the opening of the insulation layer, wherein the barrier layer includes boron at a concentration that decreases from a first surface contacting the sidewall and the bottom of the opening to a second surface opposite to the first surface;
    forming an interconnection on the barrier layer in the opening, wherein the interconnection is electrically connected to one of the plurality of lower conductive structures; and
    forming an upper conductive structure on the insulation layer, wherein the upper conductive structure is electrically connected to the interconnection to electrically connect the upper conductive structure to the one of the plurality of lower conductive structures through the interconnection.

2. The method of claim 1, wherein forming the barrier layer comprises:
    forming a first preliminary barrier layer including an amount of boron on the sidewall and the bottom of the opening and on a surface of the insulation layer; and
    forming a second preliminary barrier layer on the first preliminary barrier layer along a profile of the insulation layer, wherein an amount of boron included in the second preliminary barrier layer is less than the amount of boron included in the first preliminary barrier layer.

3. The method of claim 2, wherein forming the first preliminary barrier layer comprises:
    supplying first reaction gases including first metal materials into a process chamber at a first flow rate to chemisorb the first reaction gases onto the sidewall and the bottom of the opening and the surface of the insulation layer;
    supplying first purge gases into the process chamber to remove a residual of the first reaction gases, that are not chemisorbed, from the process chamber;
    supplying second reaction gases including boron into the process chamber at a second flow rate greater than the first flow rate to form a first metal layer including boron on the sidewall and the bottom of the opening and the surface of the insulation layer;
    supplying second purge gases into the process chamber to remove a residual of the second reaction gases, that are not reacted with the first reaction gases, and byproducts from the process chamber; and
    nitrating the first metal layer to form a first metal nitride layer.

4. The method of claim 3, wherein supplying the second reaction gases comprises supplying the second reaction gases at the second flow rate in range of about 1.2 to about 3 times that of the first flow rate.

5. The method of claim 3, wherein the first metal materials include tungsten (W) so that the first metal nitride layer includes a boron-rich tungsten nitride layer.

6. The method of claim 3, wherein forming the second preliminary barrier layer comprises:
    supplying third reaction gases including second metal materials into the process chamber at the first flow rate to chemisorb the third reaction gases onto the first metal nitride layer;
    supplying third purge gases into the process chamber to remove a residual of the third reaction gases, that are not chemisorbed, from the process chamber;
    supplying fourth reaction gases including boron into the process chamber at a third flow rate less than the second flow rate to form a second metal layer on the first metal nitride layer such that an amount of boron included in the second metal layer is less than an amount of boron included in the first metal layer;
    supplying fourth purge gases into the process chamber to remove a residual of the fourth reaction gases, that are not reacted with the third reaction gases and byproducts, from the process chamber; and
    nitrating the second metal layer to form a second metal nitride layer.

7. The method of claim 6, wherein supplying the fourth reaction gases comprises supplying the fourth reaction gases at the third flow rate in range of about 1 to about 1.2 times that of the first flow rate.

8. The method of claim 6, wherein forming the first metal layer comprises forming the first metal layer at a first temperature and forming the second metal layer comprises forming the second metal layer at a second temperature greater than the first temperature.

9. The method of claim 8, wherein the first temperature is in range of about 200° C. to about 250° C. and the second temperature is in range of about 300° C. to about 350° C.

10. The method of claim 6, wherein the second metal materials include tungsten (W) so that the second metal nitride layer includes a tungsten-rich tungsten nitride layer.

11. The method of claim 6, wherein forming the first metal layer comprises forming the first metal layer at a first temperature and forming the second metal layer comprises forming the second metal layer at the first temperature.

12. The method of claim 11, wherein the first temperature is in range of about 360° C. to about 370° C.

13. The method of claim 1, wherein forming the barrier layer comprises forming a metal nitride layer including boron.

14. The method of claim 1, wherein forming the barrier layer comprises:
- forming a first portion of the barrier layer comprising the first surface at a first temperature; and
- forming a second portion of the barrier layer comprising the second surface at a second temperature that is higher than the first temperature.

15. The method of claim 14, wherein the first temperature is in a range of 150° C. to 350° C.

16. The method of claim 15, wherein the second temperature is in a range of 200° C. to 400° C.

\* \* \* \* \*